(12) United States Patent
Yu et al.

(10) Patent No.: US 8,411,459 B2
(45) Date of Patent: Apr. 2, 2013

(54) INTERPOSER-ON-GLASS PACKAGE STRUCTURES

(75) Inventors: Chen-Hua Yu, Hsin-Chu (TW); Jing-Cheng Lin, Hsin-Chu (TW)

(73) Assignee: Taiwan Semiconductor Manufacturing Company, Ltd, Hsin-Chu (TW)

( * ) Notice: Subject to any disclaimer, the term of this patent is extended or adjusted under 35 U.S.C. 154(b) by 210 days.

(21) Appl. No.: 12/834,943

(22) Filed: Jul. 13, 2010

(65) Prior Publication Data
US 2011/0304999 A1 Dec. 15, 2011

Related U.S. Application Data

(60) Provisional application No. 61/353,580, filed on Jun. 10, 2010.

(51) Int. Cl.
*H05K 7/00* (2006.01)
*H05K 1/16* (2006.01)

(52) U.S. Cl. ........ 361/783; 361/760; 361/761; 361/762; 174/260

(58) Field of Classification Search .................. None
See application file for complete search history.

(56) References Cited

U.S. PATENT DOCUMENTS

| | | | |
|---|---|---|---|
| 5,371,654 A * | 12/1994 | Beaman et al. ............... | 361/744 |
| 5,374,291 A | 12/1994 | Yabe et al. | |
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,228,787 B1 | 5/2001 | Pavel | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,511,793 B1 | 1/2003 | Cho et al. | |
| 6,538,333 B2 | 3/2003 | Kong | |
| 6,599,778 B2 | 7/2003 | Pogge et al. | |
| 6,623,906 B2 | 9/2003 | Iha | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine et al. | |
| 6,780,565 B2 | 8/2004 | Iha | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |

(Continued)

OTHER PUBLICATIONS

Tummala, R.R., et al., "Trend from ICs to 3D ICs to 3D Systems," IEEE 2009 Custom Intergrated Circuits Conference (CICC), pp. 439-444.

(Continued)

*Primary Examiner* — Boris Chervinsky
(74) *Attorney, Agent, or Firm* — Slater & Matsil, L.L.P.

(57) ABSTRACT

A device includes an interposer including a substrate, and a first through-substrate via (TSV) penetrating through the substrate. A glass substrate is bonded to the interposer through a fusion bonding. The glass substrate includes a second TSV therein and electrically coupled to the first TSV.

13 Claims, 17 Drawing Sheets

U.S. PATENT DOCUMENTS

| | | | |
|---|---|---|---|
| 7,122,912 B2 | 10/2006 | Matsui | |
| 7,157,787 B2 | 1/2007 | Kim et al. | |
| 7,167,608 B2 * | 1/2007 | Ogawa | 385/14 |
| 7,193,308 B2 | 3/2007 | Matsui | |
| 7,193,311 B2 * | 3/2007 | Ogawa et al. | 257/687 |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,738,258 B2 * | 6/2010 | Ohno et al. | 361/767 |
| 2006/0202322 A1 * | 9/2006 | Kariya et al. | 257/698 |
| 2007/0205486 A1 * | 9/2007 | Shioga et al. | 257/532 |
| 2009/0057879 A1 * | 3/2009 | Garrou et al. | 257/713 |
| 2011/0170268 A1 * | 7/2011 | Takemura et al. | 361/748 |
| 2011/0193221 A1 | 8/2011 | Hu et al. | |
| 2011/0285005 A1 * | 11/2011 | Lin et al. | 257/686 |
| 2011/0291288 A1 * | 12/2011 | Wu et al. | 257/774 |

OTHER PUBLICATIONS

Oborina, E., et al., "Hydrogen-related mobile charge in the phosphosilicate glass-$SiO_2$-Si structure," Journal of Applied Physics, vol. 92, No. 11, Dec. 1, 2002, pp. 6773-6777.

Schröder, H., et al., "*glassPack*—A 3D Glass Based Interposer Concept fo SiP with Integrated Optical Interconnects," Electronic Components and Technology Conference, 2010, pp. 1647-1652.

\* cited by examiner

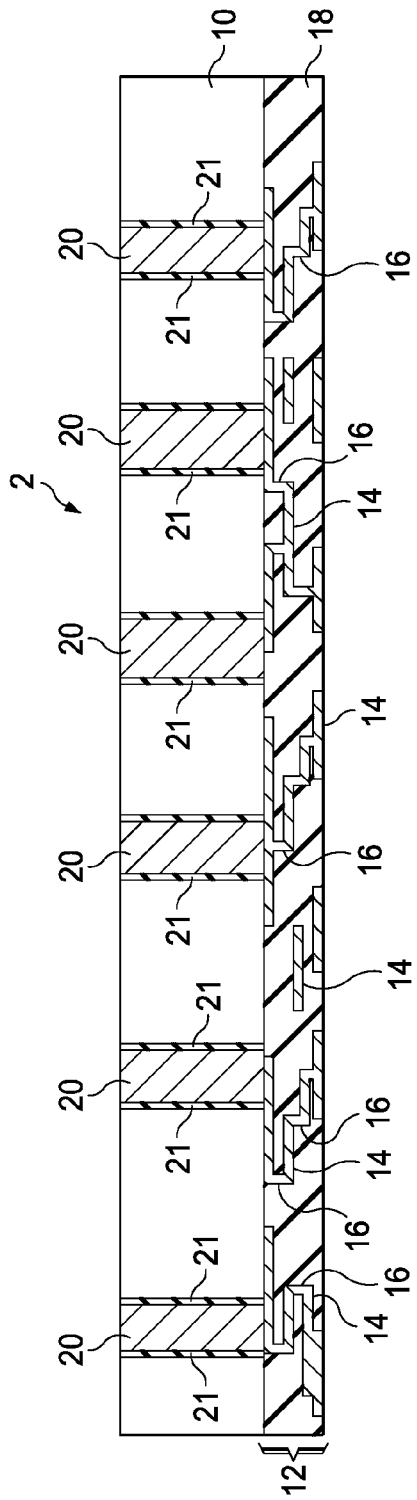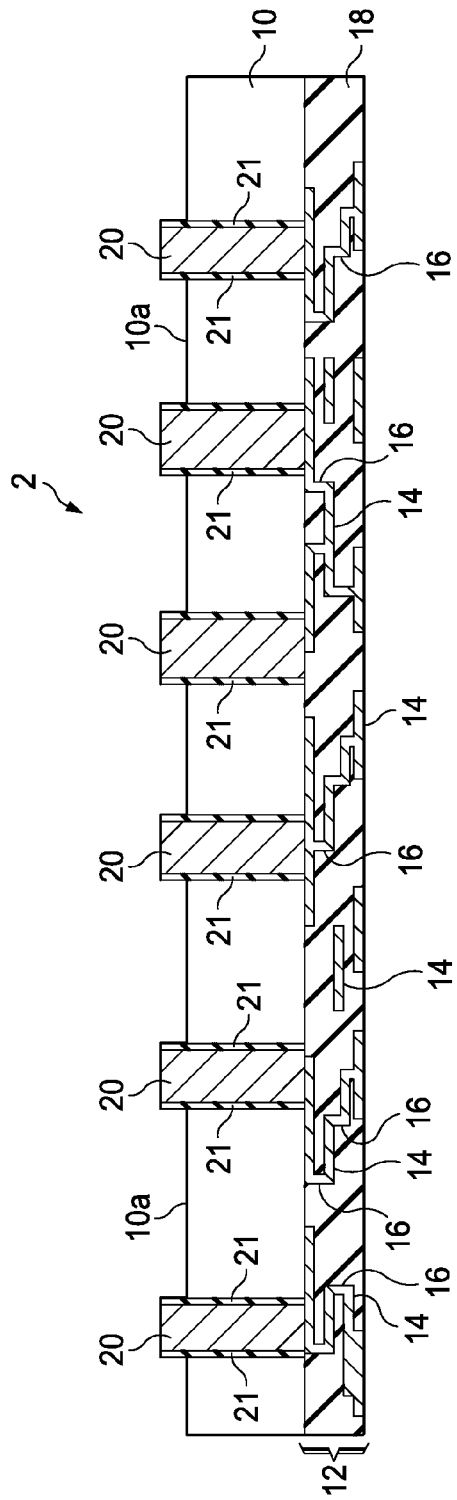
FIG. 1A
FIG. 1B

INTERPOSER-ON-GLASS PACKAGE STRUCTURES

This application claims the benefit of U.S. Provisional Application No. 61/353,580 filed on Jun. 10, 2010, entitled "Interposer-on-Glass Package Structures," which application is hereby incorporated herein by reference.

TECHNICAL FIELD

This disclosure relates generally to integrated circuit structures, and more particularly to interposer-on-glass package structures and methods for forming the same.

BACKGROUND

To increase the density of package structures, multiple dies may need to be packaged in a same package structure. To accommodate multiple dies, an interposer is typically used to bond dies thereon, and the resulting structure including the interposer and the dies are treated as a single structure.

It is desirable to form silicon interposers due to the fact that the technology for handling silicon substrates is mature. Further, features formed on silicon interposers may have a high density. However, due to various factors, such as the significant difference between the coefficient of thermal expansion (CTE) of silicon and the CTE of printed circuit board (PCB), it is difficult to bond a silicon interposer directly on a PCB without incurring reliability issues. For example, dies are bonded on a silicon interposer, which are bonded to PCB directly, the resulting package structure will suffer from reliability problems. A solution for the above-discussed problem is to insert an organic substrate between silicon interposer and PCB. This solution, however, still suffers from other issues. Firstly, organic substrates have a high cost. Secondly, organic substrates are typically soft, and hence may not be able to provide enough protection needed by other package components. Thirdly, the signal loss in organic substrates is high, particularly when the signal has a high frequency.

SUMMARY

In accordance with one aspect, a device includes an interposer including a substrate, and a first through-substrate via (TSV) penetrating through the substrate. A glass substrate is bonded to the interposer through a fusion bonding. The glass substrate includes a second TSV therein and electrically coupled to the first TSV.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 1J are cross-sectional views of intermediate stages in the manufacturing of a package structure in accordance with an embodiment, wherein a glass substrate is bonded to an interposer;

DETAILED DESCRIPTION OF ILLUSTRATIVE EMBODIMENTS

Figure 1C:
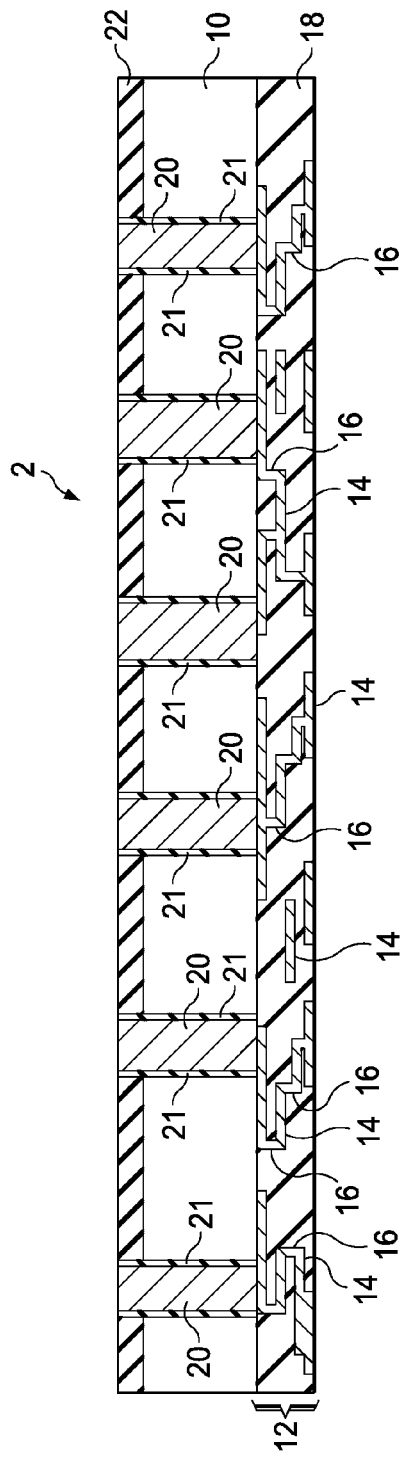

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel package structure incorporating glass substrates and the method of forming the same are provided. The intermediate stages of manufacturing various embodiments are illustrated. The variations of the embodiments are then discussed. Throughout the various views and illustrative embodiments, like reference numbers are used to designate like elements.

Referring to FIG. 1A, interposer wafer 2, which includes substrate 10 and interconnect structure 12, is provided. Substrate 10 may be formed of a semiconductor material such as silicon. Alternatively, substrate 10 is formed of a dielectric material. Interposer wafer 2 is substantially free from integrated circuit devices, including active devices such as transistors and diodes. Furthermore, interposer wafer 2 may include, or may be free from, passive devices such as capacitors, resistors, inductors, varactors, and/or the like.

Interconnect structure 12 is formed on substrate 10. Interconnect structure 12 includes one or more dielectric layer 18, and metal lines 14 and vias 16 in dielectric layer(s) 18. Throughout the description, the side of interposer wafer 2 with interconnect structure 12 is referred to as a front side, and the opposite side is referred to as a backside. Metal lines 14 and vias 16 are referred to as front-side redistribution lines (RDLs). Further, through-substrate vias (TSVs) 20 are formed in substrate 10, and are electrically coupled to front-side RDLs 14/16. Insulation layers 21 are used to separate TSVs 20 from substrate 10.

Figure 1D:
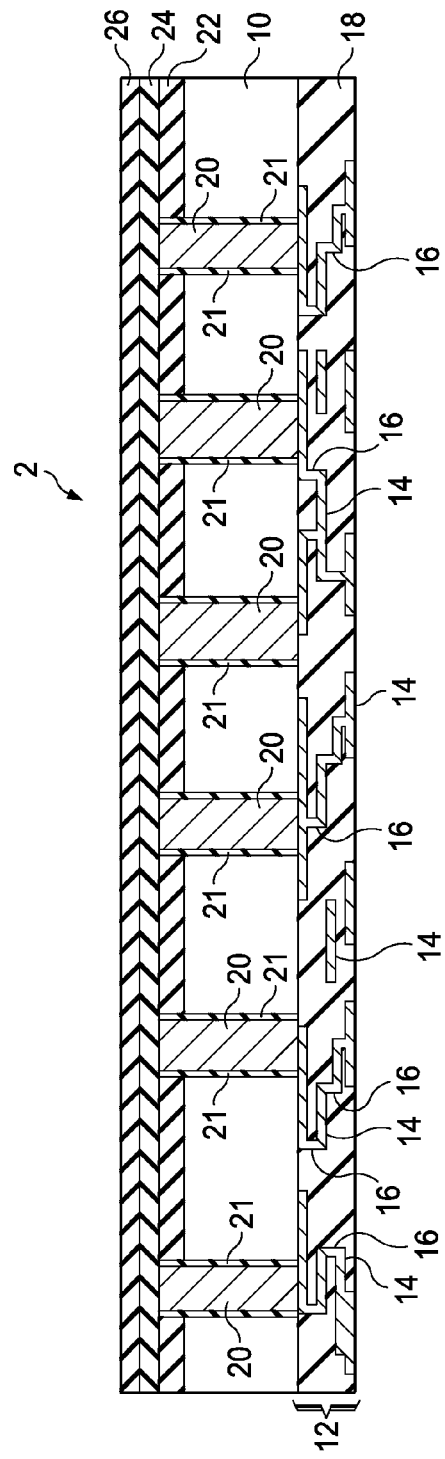

Referring to FIG. 1B, substrate 10 is etched, so that TSVs 20 protrude out of the backside surface 10a of substrate 10. Etch stop layer 22, which may be formed of silicon nitride, for example, is formed on TSVs 20 and substrate 10, and is polished or etched to form the structure as shown in FIG. 1C, wherein TSVs 20 are again exposed. Next, as shown in FIG. 1D, etch stop layer 24, which may also be formed of silicon nitride, for example, is formed on etch stop layer 22. Next, oxide layer 26, which may be a silicon oxide (SiO) layer, is formed. The formation methods of etch stop layers 22/24 and oxide layer 26 include commonly used deposition methods such as plasma enhance chemical vapor deposition (PECVD). In alternative embodiments, additional RDLs 58 (not shown in FIG. 3D, please refer to FIGS. 6 and 8) may be formed on the back side of substrate 10, wherein one or more layer of RDLs 58 may be formed.

Figure 1E:
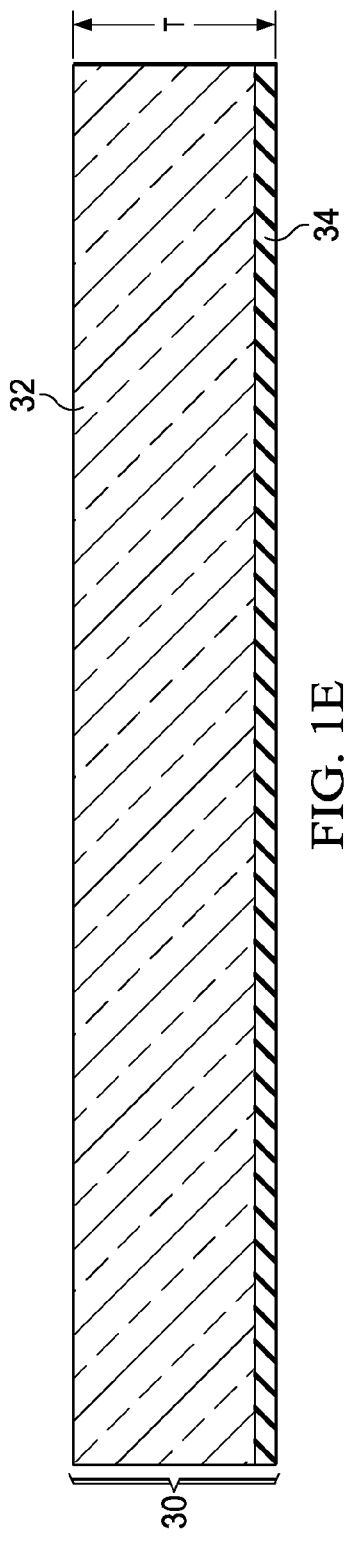

FIG. 1E illustrates glass substrate 30, which includes glass layer 32. Glass layer 32 may be formed of $SiO_2$, $LiO_2$, $CeO_2$, $Al_2O_3$, $B_2O_3$, or the like. Optionally, oxide layer 34 such as silicon oxide (SiO) may be formed on the surface of glass layer 32. In an embodiment, thickness T of glass substrate 30 is less than about 800 μm, or even less than about 200 μm.

Figure 1F:
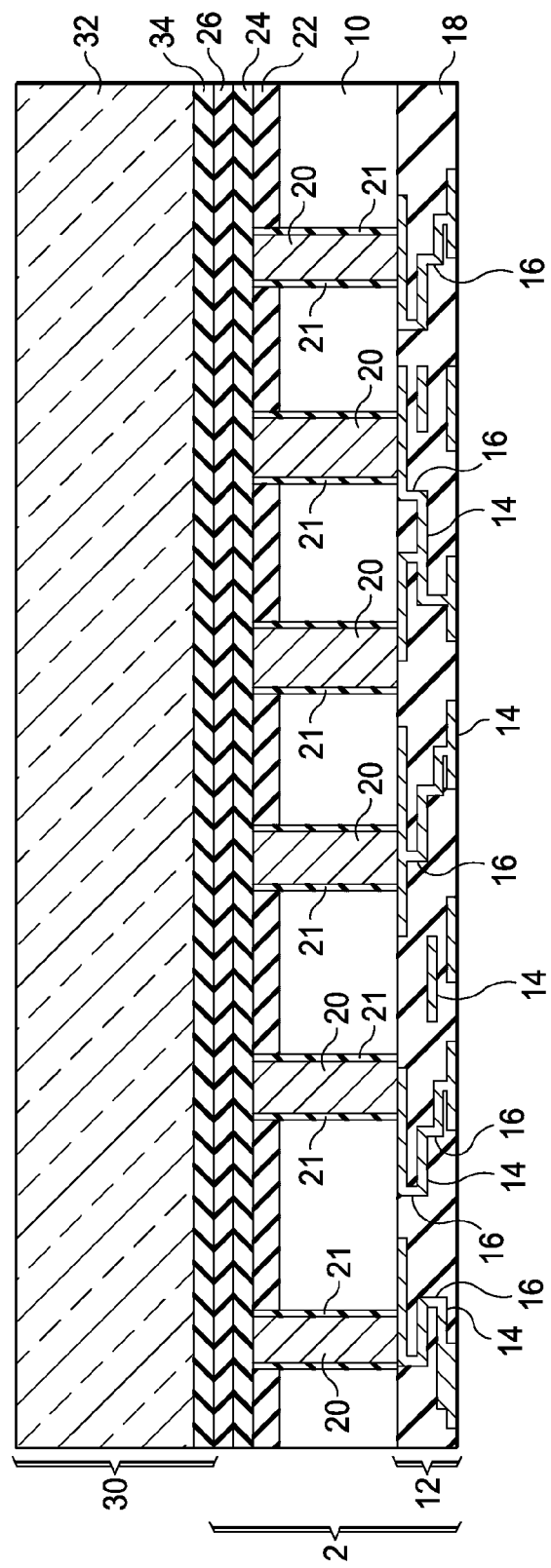

Next, as shown in FIG. 1F, glass substrate 30 is bonded to interposer wafer 2 through the fusion bond (oxide-to-oxide bond). In an embodiment wherein oxide layer 34 is formed, oxide layer 34 is bonded to oxide layer 26. In alternative embodiments wherein the glass in glass layer 32 itself is also an oxide, or the surface of glass layer 32 is oxidized, oxide layer 34 is not formed, and glass layer 32 is bonded to, and contacts, oxide layer 26 directly.

Figure 1G:
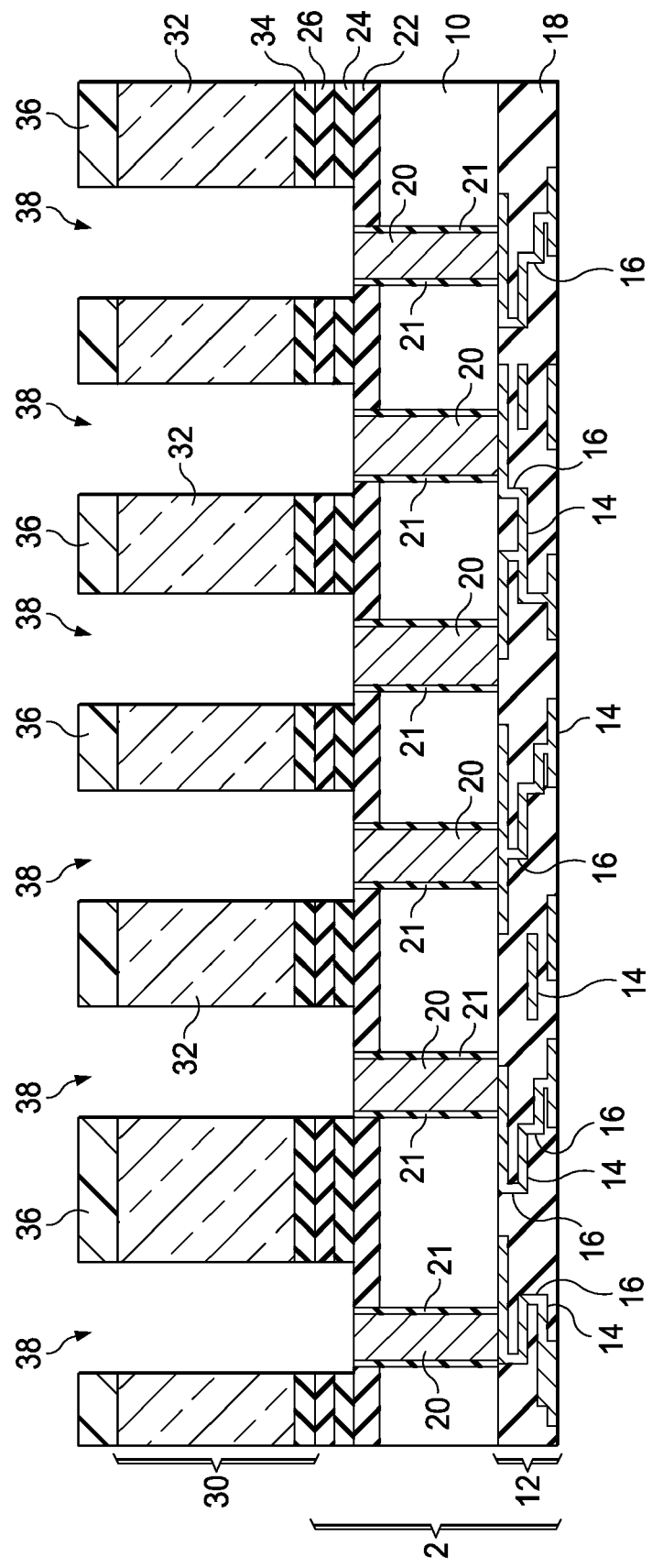

Referring to FIG. 1G, photo resist 36 is formed on glass substrate 30, and is patterned. Openings 38 are then formed by etching glass substrate 30 and underlying layers 24, 26, and 34, until TSVs 20 are exposed. During the etching step, etch stop layer 24 functions to stop the etching process, and is then etched to expose TSVs 20.

Figure 1H:
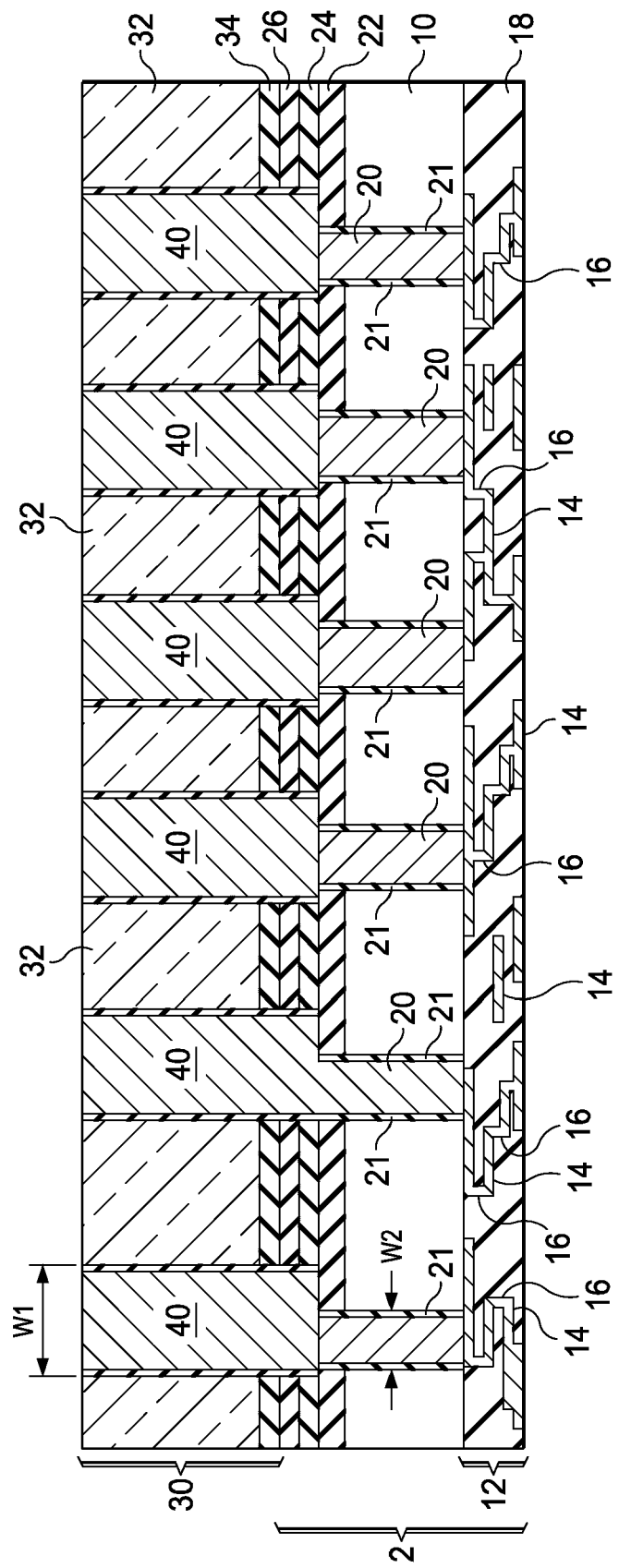

Next, as shown in FIG. 1H, TSVs 40 are formed in openings 38, and may be electrically coupled to TSVs 20. In an embodiment, the lateral dimension W1, which may be a length/width or a diameter, depending on the top-view shape of TSVs 40, is greater than lateral dimension W2 of TSVs 20. The formation of TSVs 40 may include a plating process for fill openings 38 with a metallic material such as copper, tungsten, a solder material, or the like, and then performing a chemical mechanical polish (CMP) to remove excess portions of the metallic material over glass substrate 30.

Figure 1I:
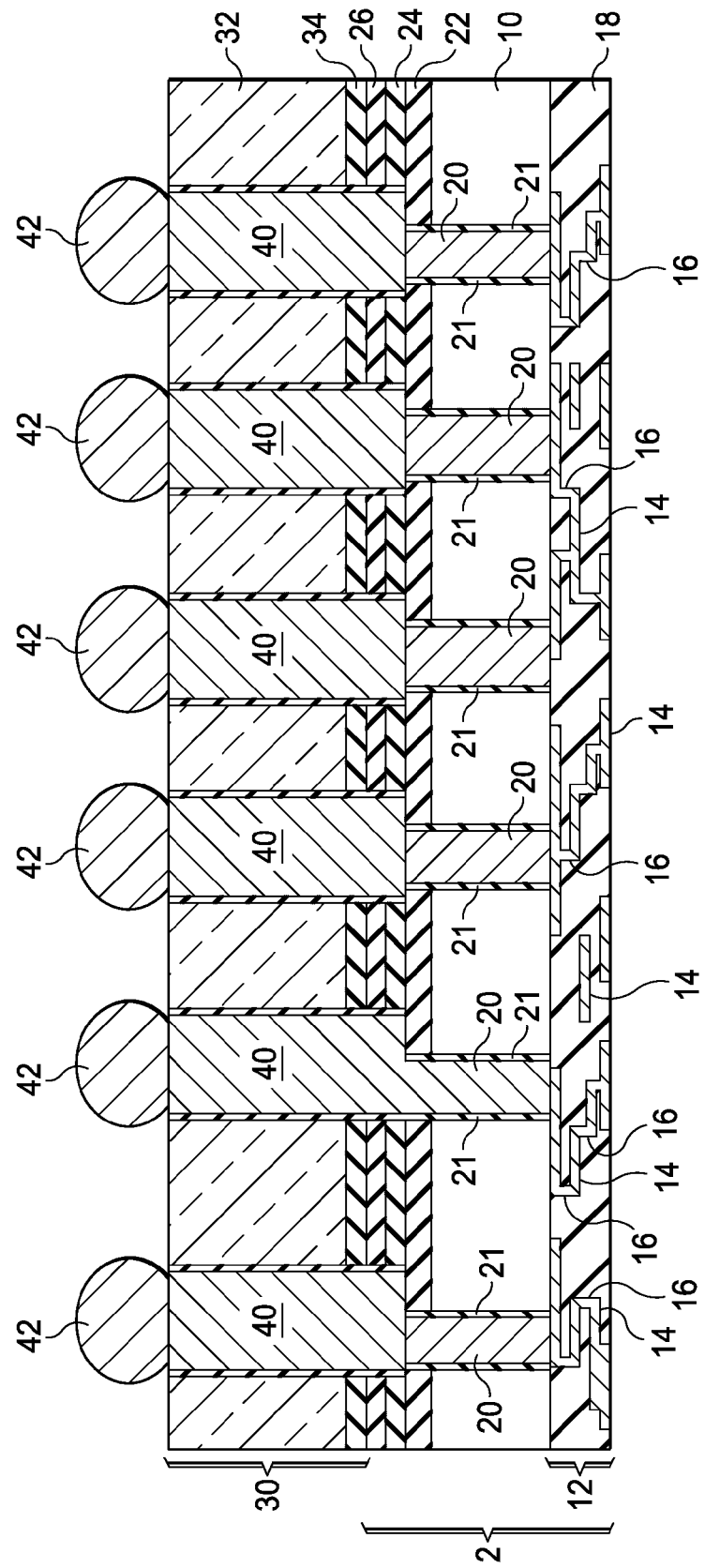
Figure 1J:
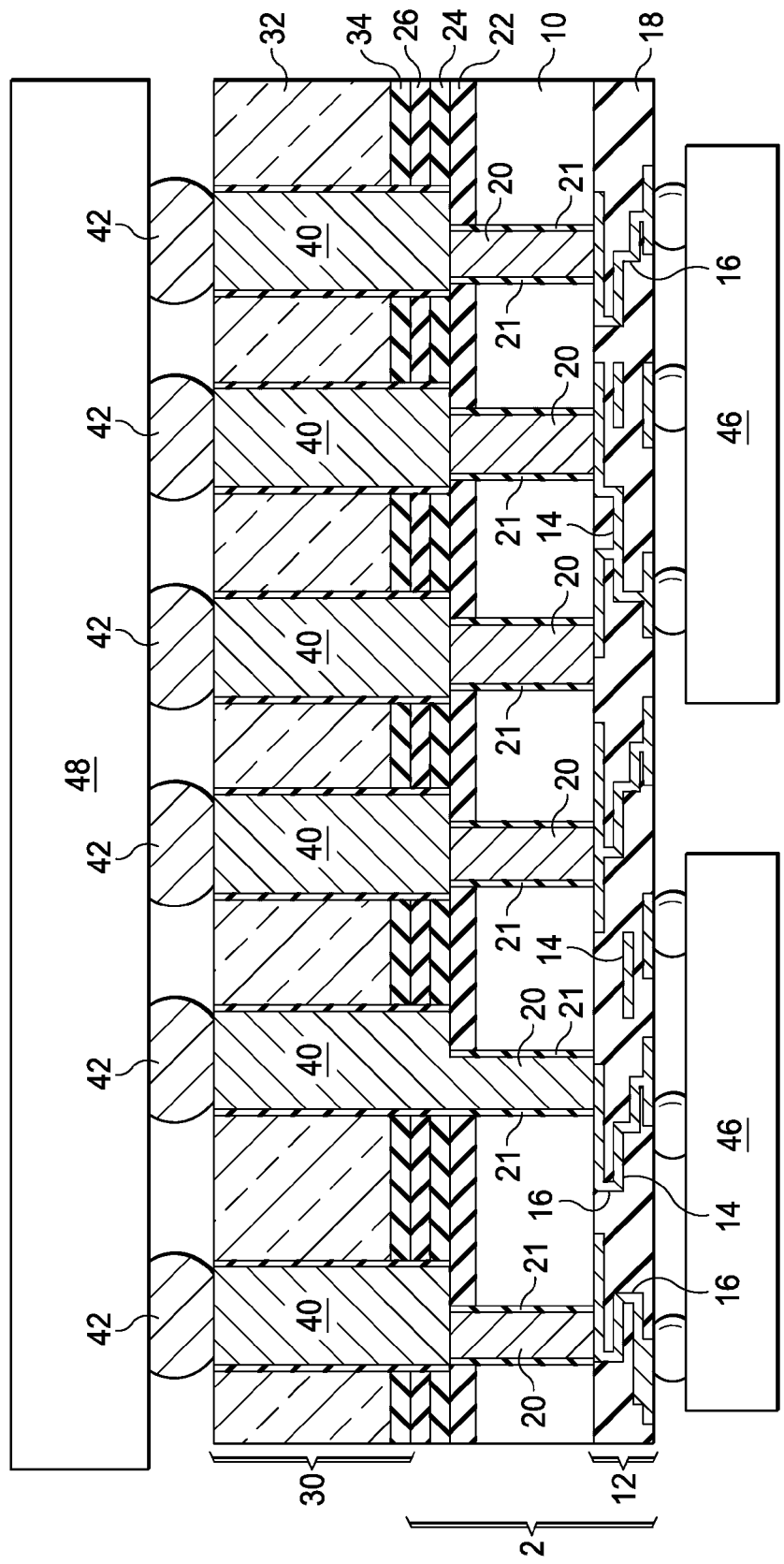

FIG. 1I illustrates the formation of solder bumps 42 over glass substrate 30 and electrically coupled to TSVs 40. The resulting package structure as shown in FIG. 3I may then be sawed apart, resulting in a plurality of package structures. FIG. 1J illustrates one of the resulting package structures, wherein an interposer (a piece sawed from interposer wafer 2) is also denoted using reference numeral 2, while a piece of glass substrate that is a piece of glass substrate 30 is also denoted using reference numeral 30. Solder bumps 42 in the resulting package structure may be bonded to printed circuit board (PCB) 48 or other package components such as a package substrate. Further, interconnect structure 12 of interposer 2 may be bonded to die(s) 46.

Figure 2A:
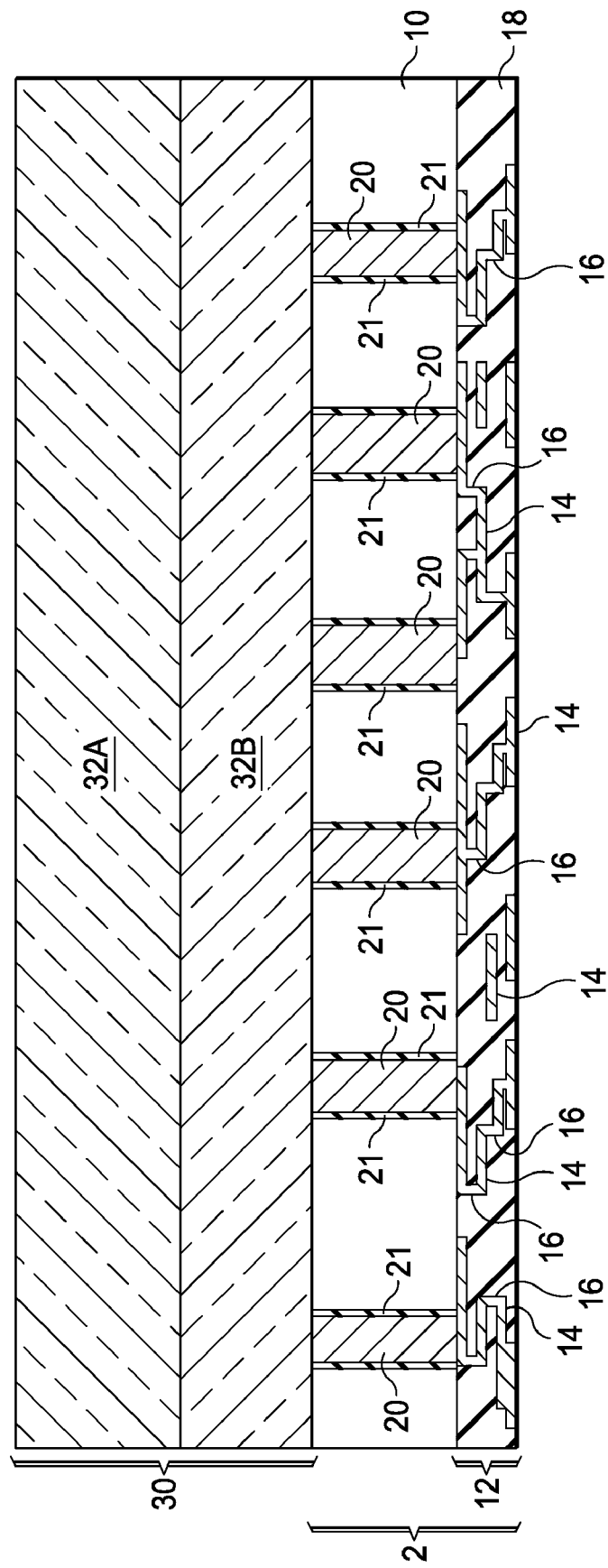
FIGS. 2A through 2D are cross-sectional views of intermediate stages in the manufacturing of a package structure in accordance with alternative embodiments, wherein a composite glass substrate is bonded to an interposer.
Figure 2B:
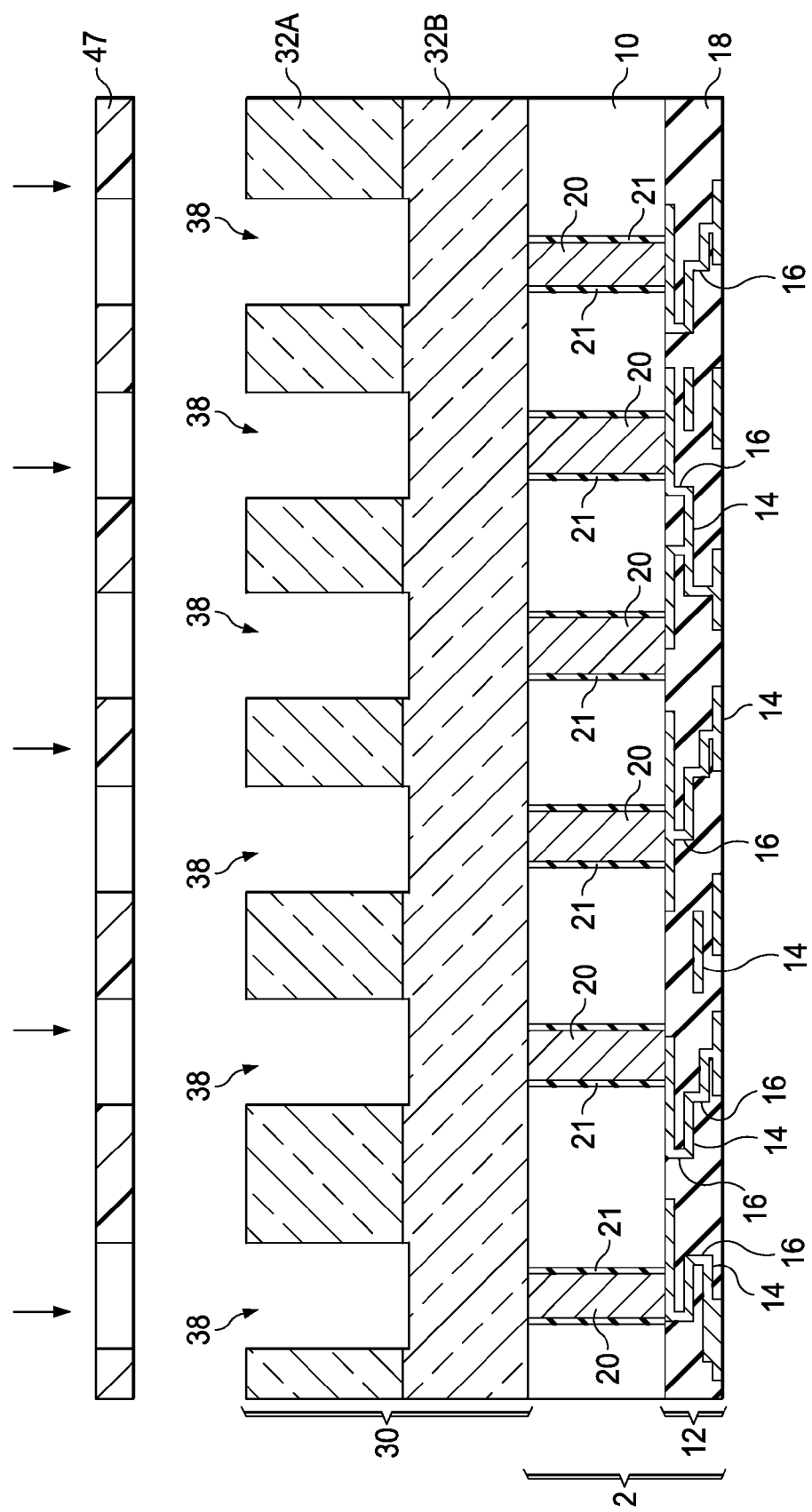
Figure 2C:
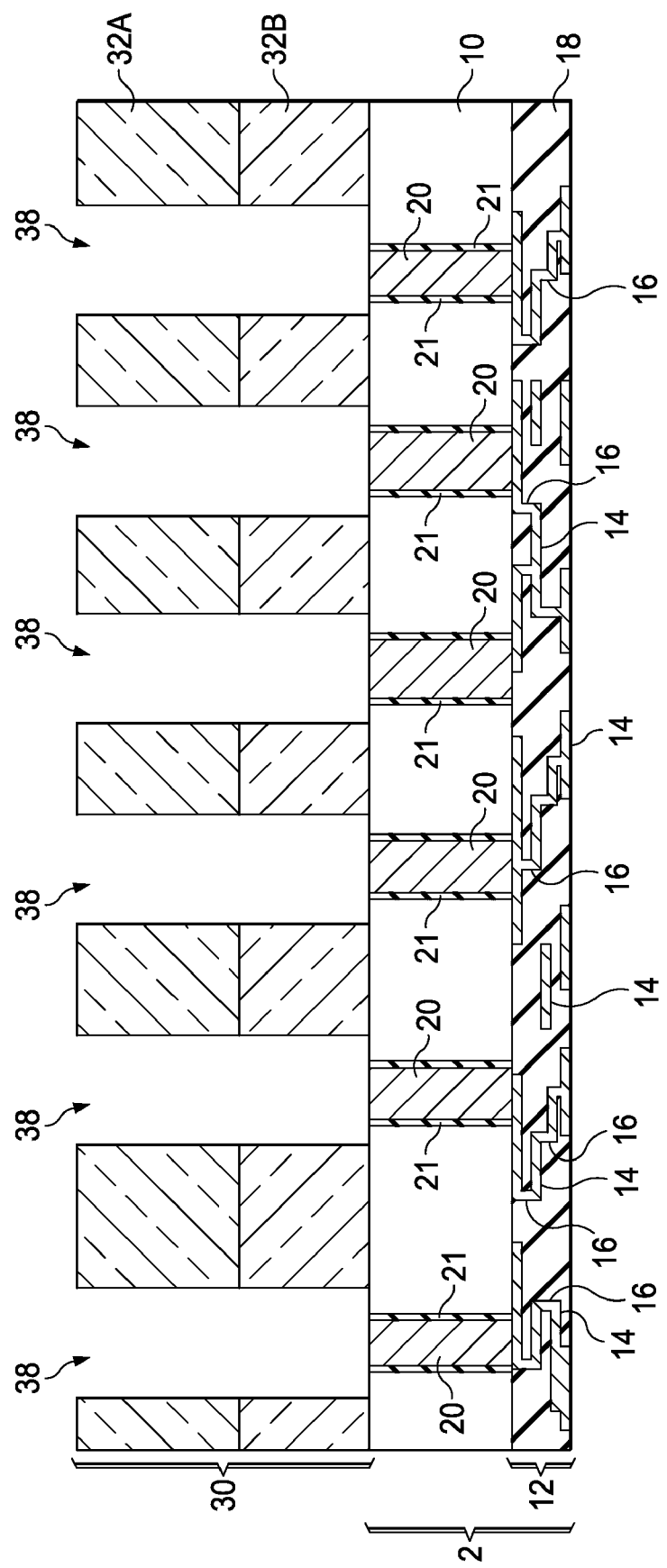

FIGS. 2A through 2D illustrate alternative embodiments. Unless specified otherwise, the reference numerals in embodiments shown in FIGS. 2A through 10 represent like elements in the embodiments illustrated in FIGS. 1A through 1J. For simplicity, the detailed structures such as layers 22, 24, 26, and 34, which are involved in the bonding between glass substrate 30 and interposer wafer 2 (as shown in detail in FIGS. 1A through 1F) are not illustrated, although these structures may also be used in all embodiments throughout the disclosure. The initial steps of this embodiment is essentially the same as shown in FIGS. 1A through 1F, except glass layer 32 is a composite glass substrate comprising photo-sensitive glass layer 32A, and non-photo-sensitive glass layer 32B, wherein the resulting bonded structure is shown in FIG. 2A. Referring to FIG. 2B, photo-sensitive glass layer 32A is exposed to light using lithography mask 47, for example. In an embodiment, the portions of photo-sensitive glass layer 32A that are subject to the light exposure (symbolized by arrows) are removed, while the portions not exposed to light are not removed. In alternative embodiments, the portions of photo-sensitive glass layer 32A that are not subject to the light exposure (symbolized by arrows) are removed, while the portions exposed to light are not removed. Referring to FIG. 2C, the patterned photo-sensitive glass layer 32A acts as a hard mask for the etching of underlying non-photo-sensitive glass layer 32B, and hence the resulting openings 38 extend to TSVs 20.

Figure 2D:
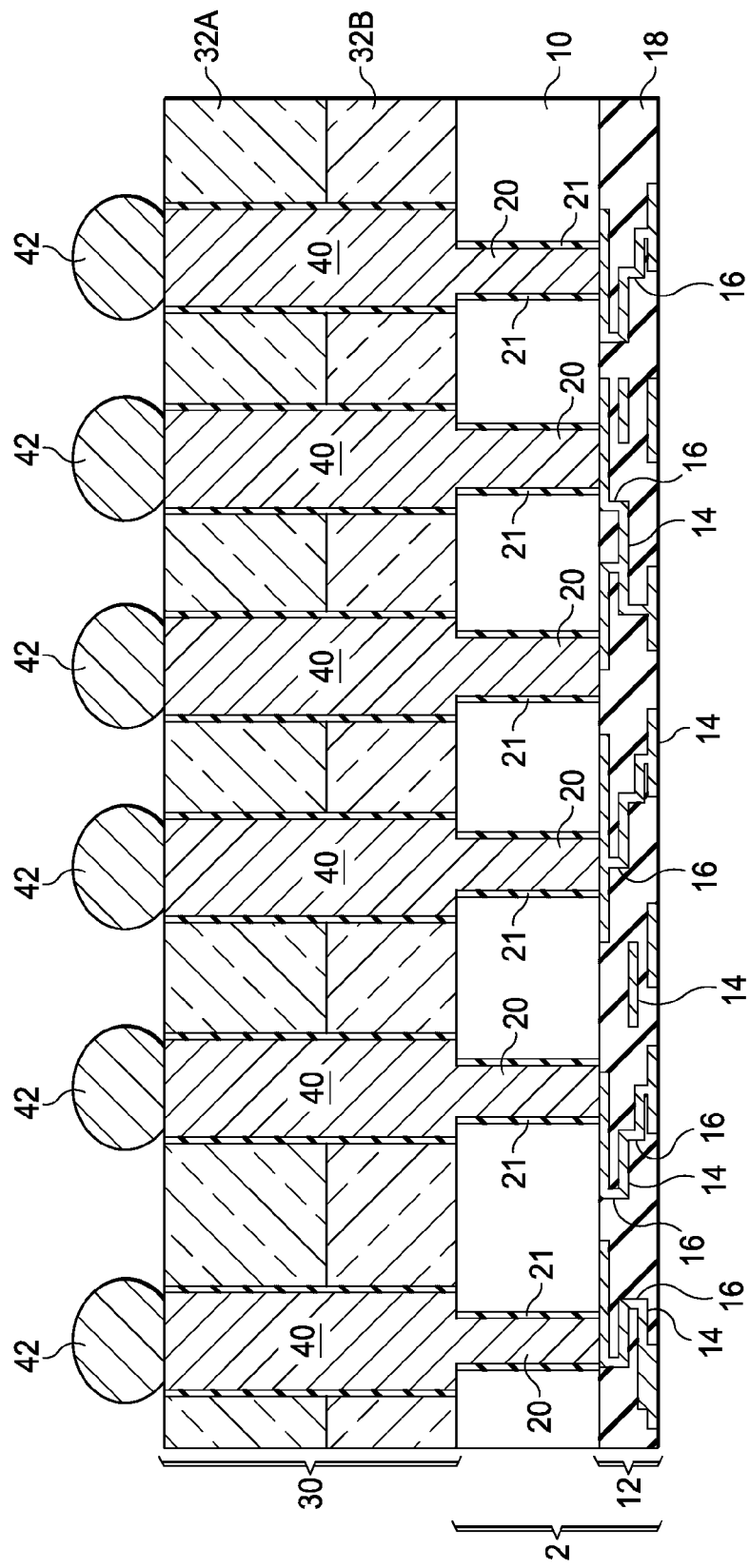

Next, as shown in FIG. 2D, TSVs 40 are formed, and bumps 42 are formed to electrically couple to TSVs 40. Processes are then continued, in which the package structure as shown in FIG. 4D is sawed, and a package component (not shown in FIG. 2D, please refer to package component 48 in FIG. 1J) such as a package substrate or a PCB is bonded to bumps 42. Further, die(s) 46 (not shown in FIG. 2D, please refer to FIG. 1J) may be bonded to interconnect structure 12. The process steps are essentially the same as shown in FIG. 1J, and are not discussed herein.

Figure 3:
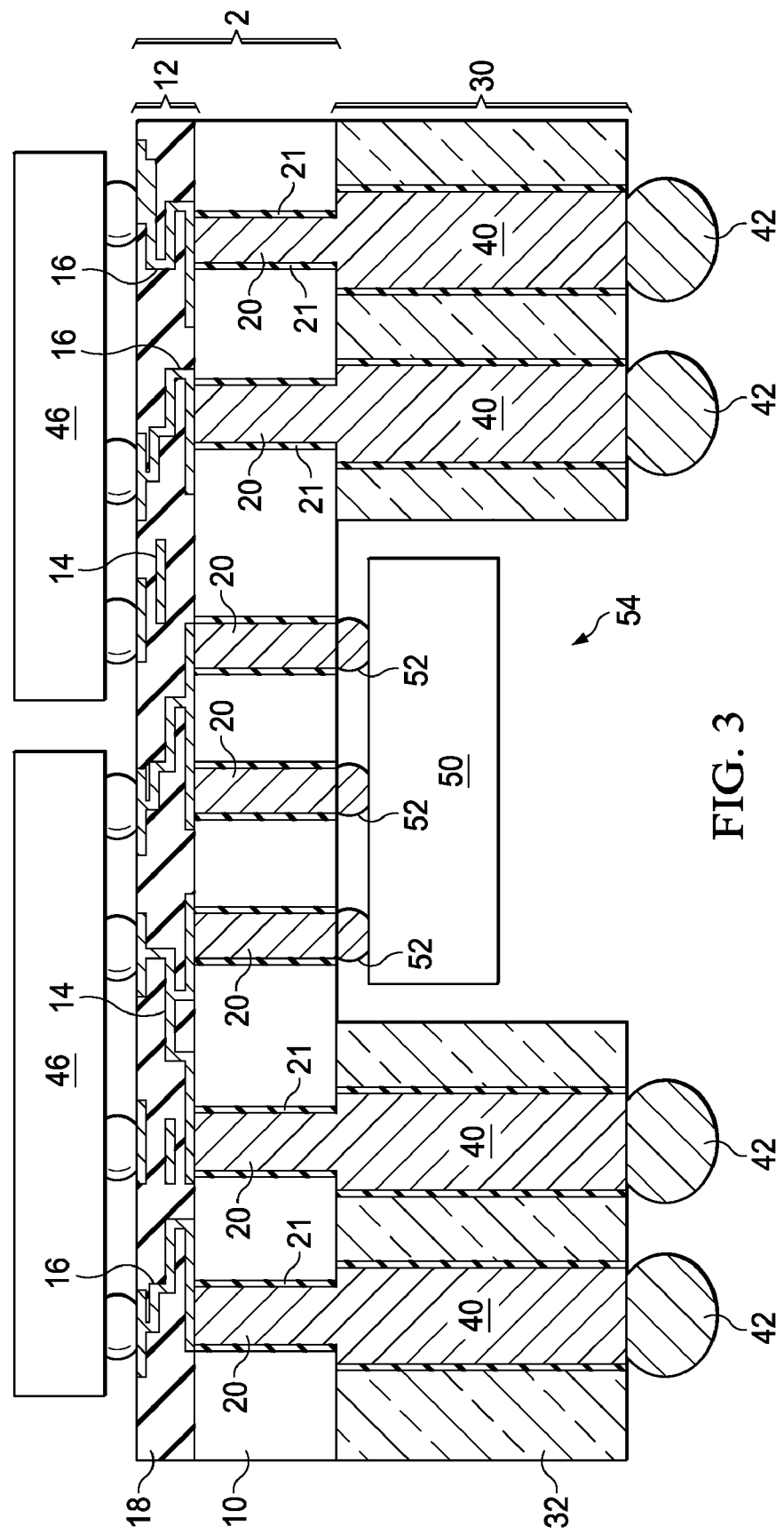
FIGS. 3 though 8 illustrate package structures in accordance with various embodiments, wherein openings are formed in glass substrates, with dies located in the openings.
Figure 4:
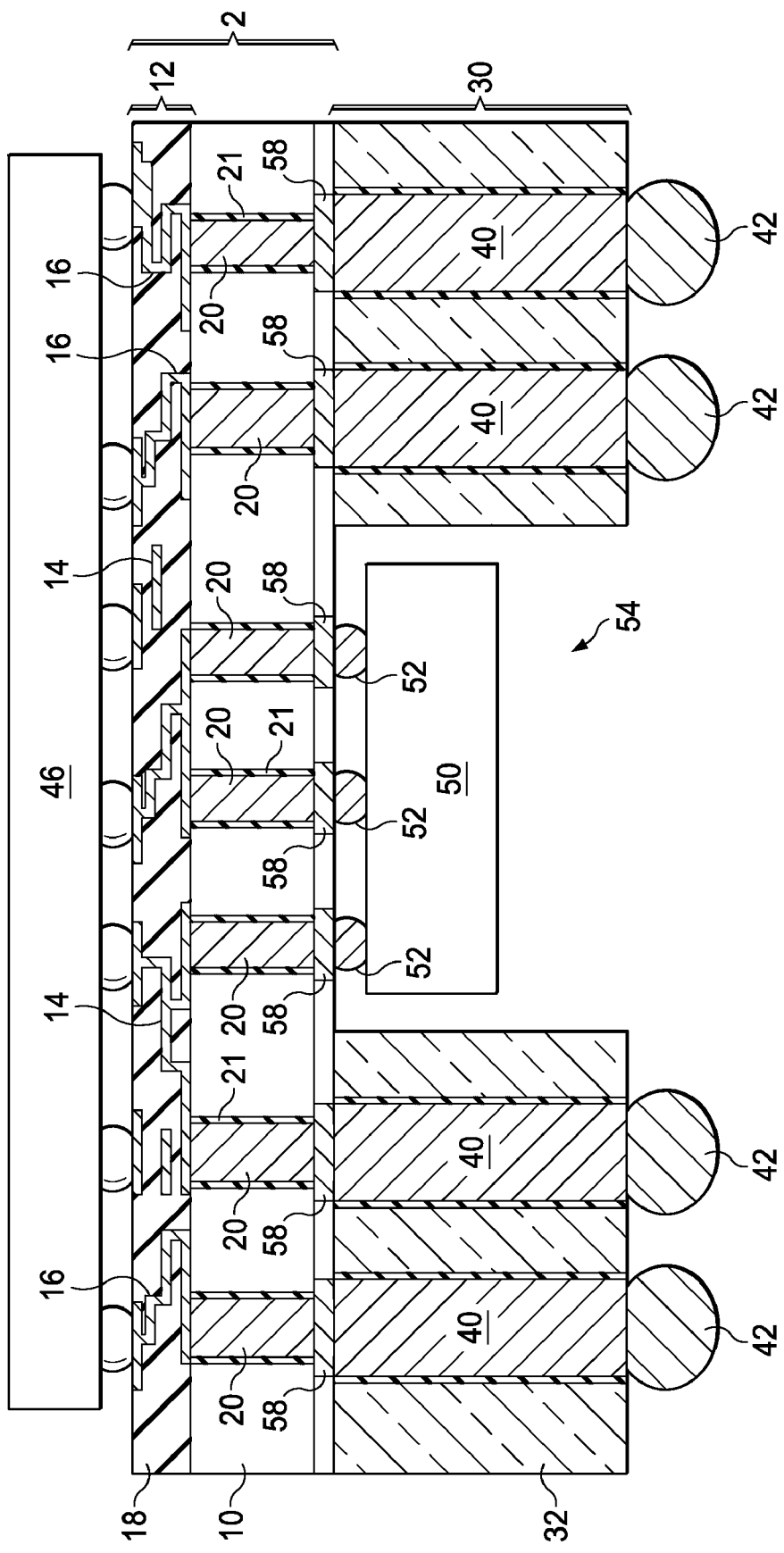
Figure 5:
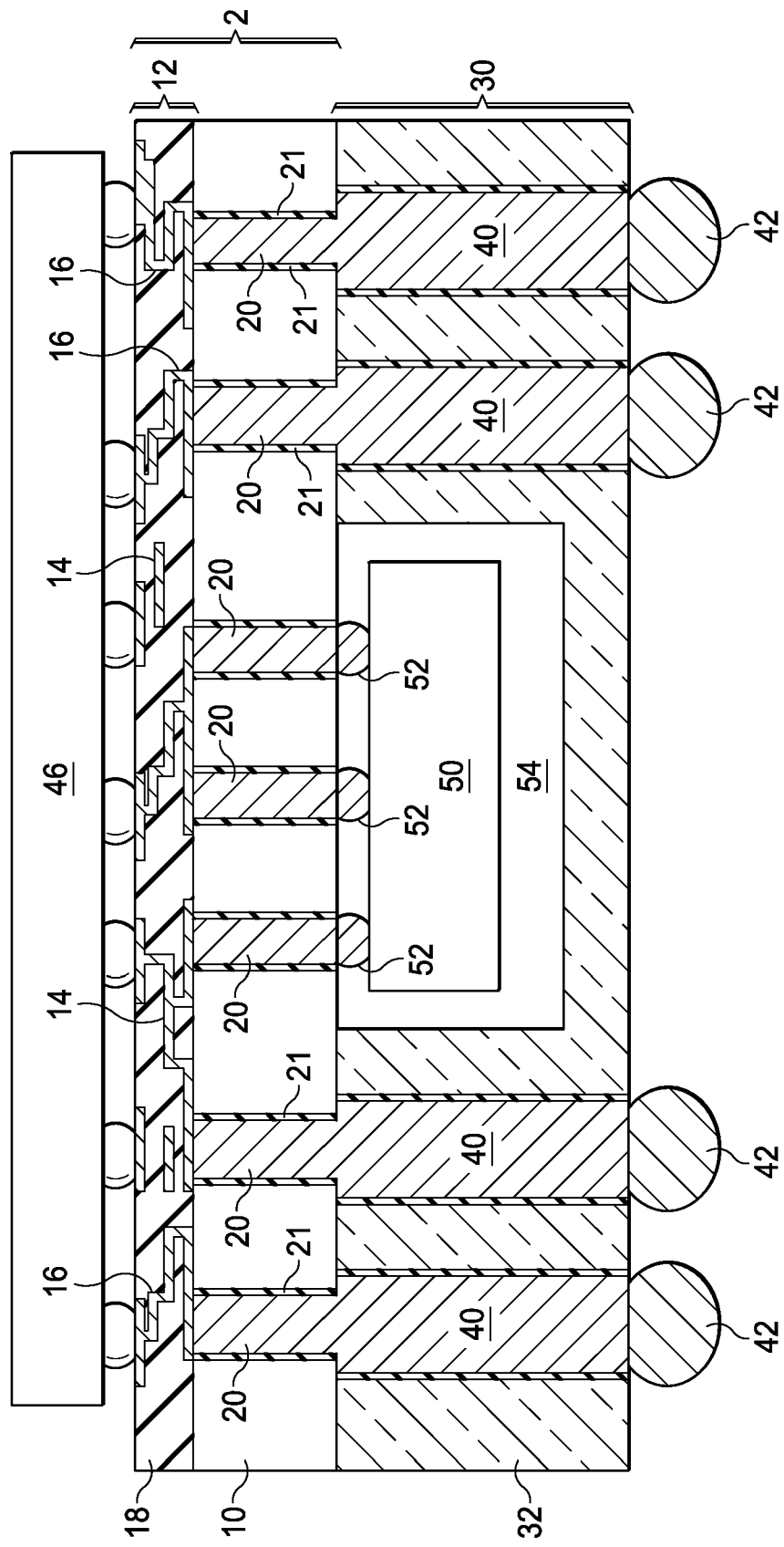

FIGS. 3 through 8 illustrate variations of the embodiments. Again, the formation details of layers 22/24/26/34 as shown in FIG. 1F of these embodiments are not shown, and may be realized by applying the teaching as shown in FIGS. 1A through 1E. Referring to FIG. 3, die 50 is directly bonded to interposer 2 (which is a piece sawed from interposer wafer 2 as shown in FIG. 1I) through bumps 52. Die 50 may be located in opening 54 (alternatively referred to as a pocket) in glass substrate 30, wherein opening 54 may be a through-opening penetrating from one side to the opposite side of glass substrate 30. Through-opening 54 may be pre-formed before glass substrate 30 is bonded to interposer wafer 2, or formed simultaneously with the formation of openings 38 (not shown in FIG. 3, please refer to FIG. 1G). FIG. 5 also illustrates that more than one die 46 may be bonded to interposer 2.

FIG. 4 illustrates yet another embodiment, wherein RDLs 58 are formed between interposer 2 and glass substrate 30. RDLs 58 may be pre-formed on interposer wafer 2 (or pre-formed on glass substrate 30) before interposer (wafer) 2 is formed on glass substrate 30. Although FIG. 4 only illustrates one layer of RDLs 58, more than one layer of RDLs may be formed. With the formation of RDLs 58, TSVs 40 do not have to be vertically aligned to TSVs 20. Instead, TSVs 40 and TSVs 20 can be fully or partially misaligned, and electrically coupled with each other through RDLs 58.

Figure 6:
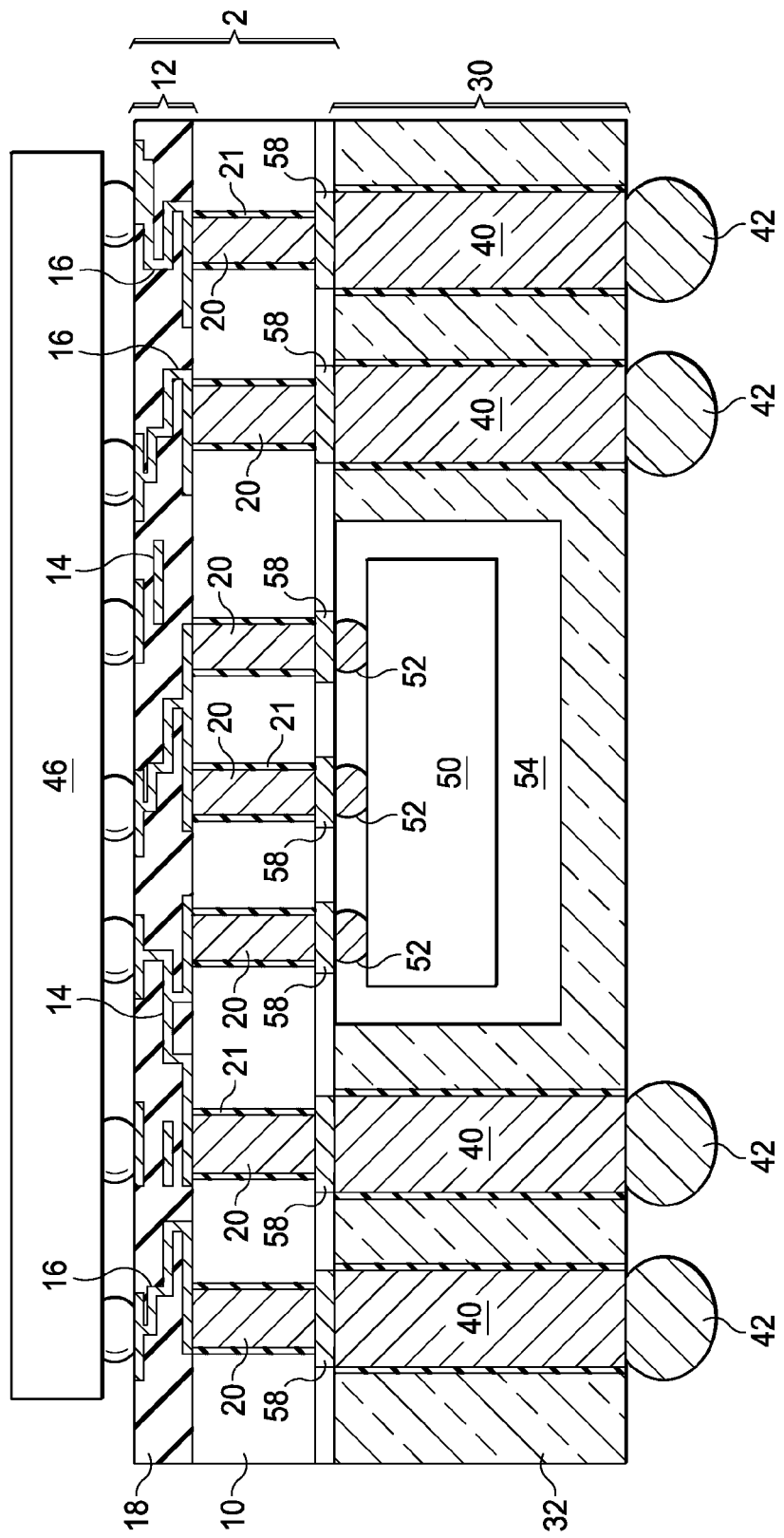

In FIG. 5, opening 54 extends only partially into glass substrate 30 and stops at an intermediate level of glass substrate 30. Die 50 is located in opening 54. In an exemplary embodiment for forming the structure, opening 54 is pre-formed in glass substrate 30 before interposer wafer 2 is bonded with glass substrate 30. Further, die 50 may be bonded to interposer wafer 2 before the bonding of interposer wafer 2 to glass substrate 30 is performed. Accordingly, after interposer wafer 2 and glass substrate 30 are bonded, die 50 is protected by glass substrate 30. FIG. 6 illustrates a package structure similar to the structure shown in FIG. 5, except RDLs 58 are further formed.

Figure 7:
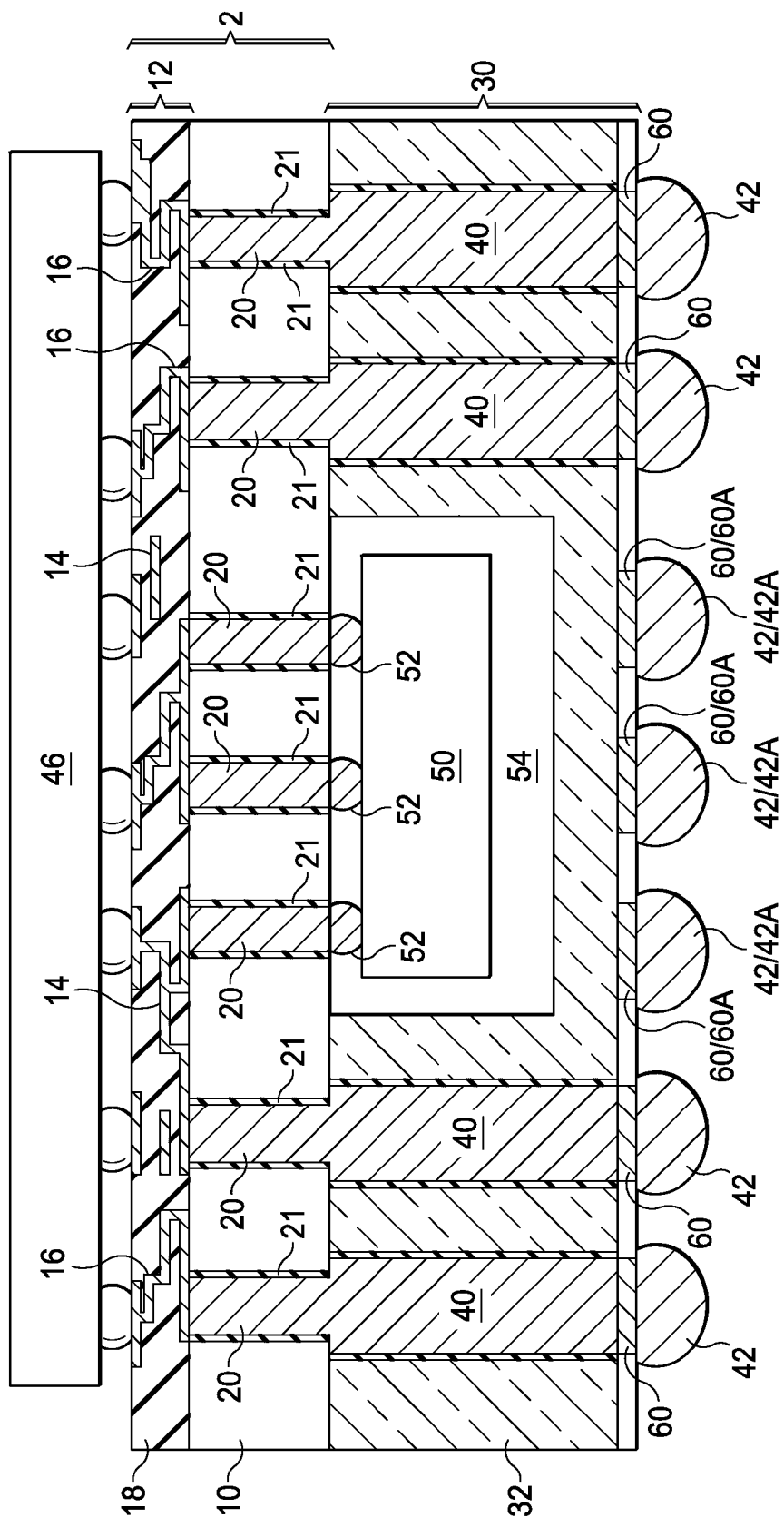
Figure 8:
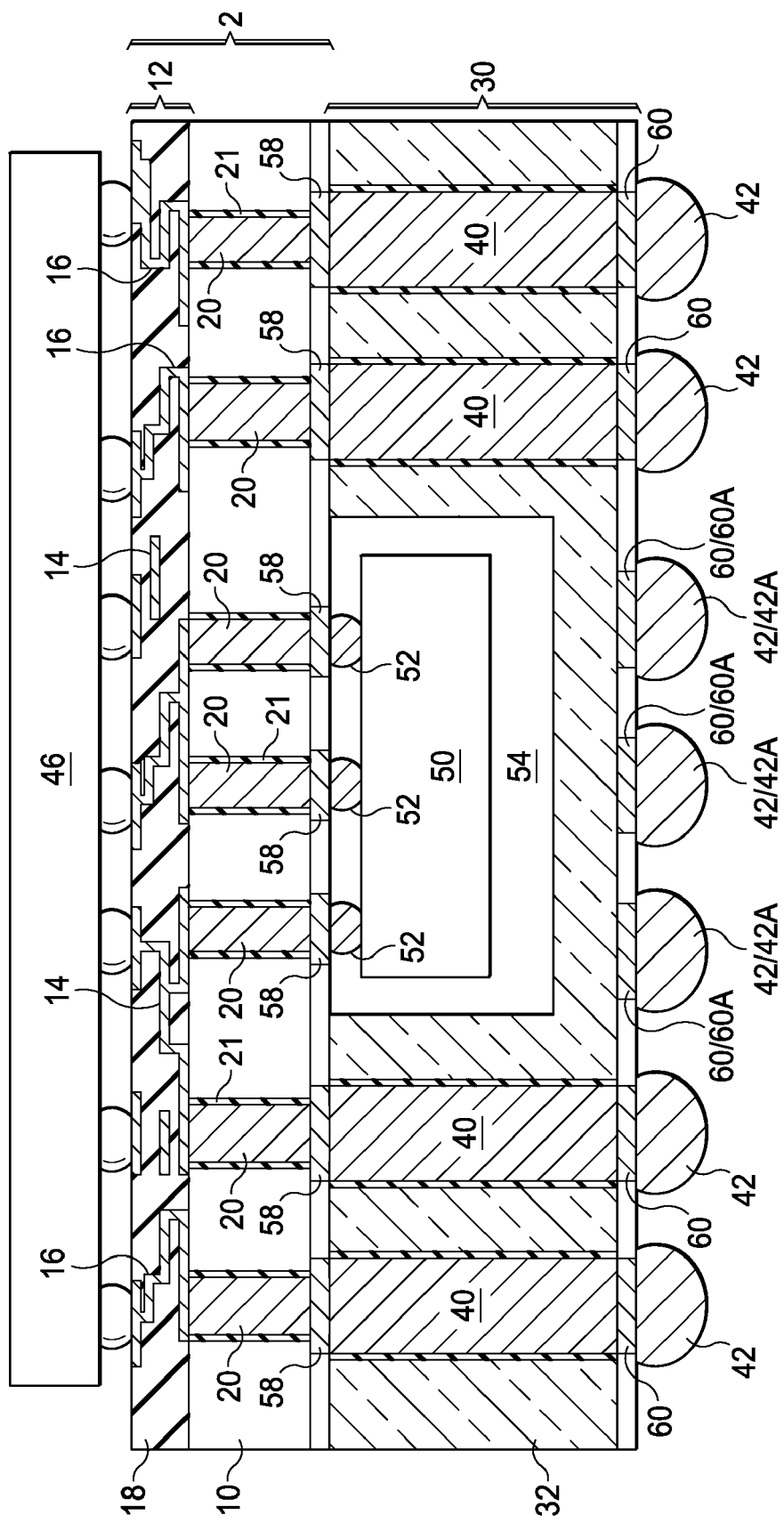

FIGS. 7 and 8 illustrate package structures similar to the package structures shown in FIGS. 5 and 6, respectively, with additional RDLs 60 formed on the surface of glass substrate 30 and on the opposite side of interposer 2. RDLs 60 are formed between, and electrically coupling, solder bumps 42 and TSVs 40. Although only one layer of RDLs 60 is shown, more than one layer of RDLs 60 may be formed. With the formation of RDLs 60, bumps 42 do not have to be vertically aligned to TSVs 40. Instead, bumps 42 and TSVs 40 can be fully or partially misaligned, and electrically coupled through RDLs 60. Bumps 42 may thus be formed substantially uniformly, and the space vertically overlapping die 50 may also be used to form solder bumps 42. In FIGS. 7 and 8, portions of bumps 42 (marked as bumps 42A) and portions of RDLs 60 (marked as RDLs 60A) vertically overlap opening 54, and possibly vertically overlap die 50.

In the embodiments, the low-cost glass substrates are used to replace the expensive organic substrates, and hence the manufacturing cost is reduced. Further, the photo-sensitive glass that may be integrated in glass substrates can be used as hard masks, and hence the manufacturing process is simpler and easier to control. The loss of high-frequency signals in glass substrates is also low, and hence the electrical characteristics of the package structures are also improved.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   an interposer comprising:
      a substrate; and
      a first through-substrate via (TSV) penetrating through the substrate;
   a glass substrate bonded to the interposer, wherein the glass substrate comprises a second TSV therein and electrically coupled to the first TSV;
   a silicon nitride layer between the interposer and the glass substrate, wherein the silicon nitride layer contacts the substrate in the interposer; and
   an oxide layer between the silicon nitride layer and the glass substrate.

2. The device of claim 1 further comprising:
   a die bonded to the interposer, wherein the die and the glass substrate are on opposite sides of the interposer; and
   a solder bump electrically coupled to the second TSV, wherein the solder bump and the interposer are on opposite sides of the glass substrate.

3. The device of claim 2 further comprising a printed circuit board (PCB) bonded to the solder bump.

4. The device of claim 1, wherein the glass substrate comprises a photo-sensitive glass layer, and a non-photo-sensitive glass layer bonded to the photo-sensitive glass layer.

5. The device of claim 4, wherein the non-photo-sensitive glass layer is between the photo-sensitive glass layer and the interposer.

6. The device of claim 1, wherein the interposer comprises a silicon substrate, and wherein no active device is formed in the interposer.

7. The device of claim 1 further comprising a redistribution line between the interposer and the glass substrate, wherein the redistribution line electrically couples the first TSV to the second TSV.

8. The device of claim 1, wherein the glass substrate comprises an opening, and wherein the device further comprises a die in the opening and bonded to the interposer.

9. The device of claim 8, wherein the opening penetrates through at least a portion of the glass substrate.

10. The device of claim 8, wherein the opening extends from a surface of the glass substrate facing the interposer into the glass substrate, and wherein the opening stops at an intermediate level in the glass substrate.

11. A device comprising:
    an interposer comprising:
       a silicon substrate; and
       a first plurality of through-substrate vias (TSVs) penetrating through the silicon substrate;
    a glass substrate bonded to the interposer, wherein the glass substrate comprises a second plurality of TSVs therein, with the first plurality of TSVs being electrically coupled to the second plurality of TSVs;
    an etch stop layer between the interposer and the glass substrate; and
    an oxide layer between the etch stop layer and the glass substrate, wherein the second plurality of TSVs penetrates through the oxide layer.

12. The device of claim 11, wherein the etch stop layer comprises silicon nitride.

13. The device of claim 11 further comprising:
    an opening extending from a surface of the glass substrate into at least an intermediate level of the glass substrate; and
    a die in the opening and bonded to the interposer.

* * * * *